United States Patent
Shone (10) Patent No.: US 7,541,638 B2
(45) Date of Patent: Jun. 2, 2009

(54) SYMMETRICAL AND SELF-ALIGNED NON-VOLATILE MEMORY STRUCTURE

(75) Inventor: Fuja Shone, Hsinchu (TW)

(73) Assignee: Skymedi Corporation, Taiwan (CN)

( * ) Notice: Subject to any disclaimer, the term of this patent is extended or adjusted under 35 U.S.C. 154(b) by 84 days.

(21) Appl. No.: 11/067,659

(22) Filed: Feb. 28, 2005

(65) Prior Publication Data

US 2006/0192244 A1     Aug. 31, 2006

(51) Int. Cl.
    *H01L 29/788*     (2006.01)
(52) U.S. Cl. ............... 257/316; 257/760; 257/E21.682; 257/E27.103; 257/E29.308
(58) Field of Classification Search ................ 257/316, 257/760, E21.682, E27.103, E29.308
    See application file for complete search history.

(56) References Cited

U.S. PATENT DOCUMENTS

| | | | |
|---|---|---|---|
| 4,302,766 A | 11/1981 | Guterman et al. | |
| 4,331,968 A | 5/1982 | Gosney, Jr. et al. | |
| 4,561,004 A | 12/1985 | Kuo et al. | |
| 4,622,656 A | 11/1986 | Kamiya et al. | |
| 4,803,529 A | 2/1989 | Masuoka | |
| 5,414,693 A | 5/1995 | Ma et al. | |
| 5,712,180 A | 1/1998 | Guterman et al. | |
| 6,245,614 B1 * | 6/2001 | Hsieh | 438/267 |
| 6,605,840 B1 * | 8/2003 | Wu | 257/315 |
| 6,774,428 B1 * | 8/2004 | Hung et al. | 257/315 |
| 6,917,071 B2 * | 7/2005 | Hayashi | 257/316 |

* cited by examiner

*Primary Examiner*—Howard Weiss
(74) *Attorney, Agent, or Firm*—Oliff & Berridge, PLC (57) ABSTRACT

A memory structure in a semiconductor substrate essentially comprises a first conductive line, two conductive blocks, two first dielectric spacers, a first dielectric layer, and a second conductive line. The first conductive line, e.g., a polysilicon line, is formed above the semiconductor substrate, and the two conductive blocks composed of polysilicon, for example, are formed at the two sides of the first conductive line and insulated from the first conductive line with the two first dielectric spacers. The first dielectric layer, such as an oxide/ nitride/oxide (ONO) layer, is formed on the two second conductive blocks and above the first conductive line, and the second conductive line is formed on the first dielectric layer and is substantially perpendicular to the two doping regions. Accordingly, the stack of the conductive block, the first dielectric layer, and the second conductive line form a floating gate structure which can store charges. The first conductive line and conductive blocks function as a select gate and floating gates, respectively, whereas the doping regions and the second conductive line function as bit lines and a word line, respectively.

12 Claims, 8 Drawing Sheets

SYMMETRICAL AND SELF-ALIGNED NON-VOLATILE MEMORY STRUCTURE

BACKGROUND OF THE INVENTION (A) Field of the Invention

The present invention is related to a non-volatile memory structure and, more particularly, to a symmetrical and self-aligned non-volatile memory structure with high cell density.

(B) Description of the Related Art

Erasable programmable read only memories (EPROMs) and electrically erasable programmable read only memories (EEPROMs) are well known non-volatile memory devices capable of being stored data, as well as erased and rewritten data, as desired.

The conventional non-volatile memory cells normally need high currents to operate, e.g., 200 microamperes ($\mu A$), for hot electron programming, so it is not suitable for low-power devices that are in the trend of chip development. Therefore, one form of an EEPROM device includes a so-called "split-gate" electrode has been developed to obtain high efficiency and low current programming, where the programming current can be diminished to, for example, 1 $\mu A$.

Many EEPROM devices use two polysilicon layers (one for the formation of the floating gate and another for the formation of the control gate and possibly electrical interconnects) whereas other EEPROM devices use three polysilicon layers. For example, U.S. Pat. No. 4,302,766 provides a first polysilicon layer serving as the floating gate, a second polysilicon layer serving as the control gate, and a third polysilicon layer coupled through an erase window to a portion of the first polysilicon layer for use during erasure of the cell. U.S. Pat. No. 4,331,968 also uses a third layer of polysilicon to form an erase gate, and U.S. Pat. Nos. 4,561,004 and 4,803,529 use three polysilicon layers in their own specific configurations.

U.S. Pat. No. 4,622,656 describes an EEPROM device in which a reduced programming voltage is provided by having a highly doped channel region under the select gate, and having the channel region under the floating gate being either lightly doped or doped to the opposite conductivity type, thereby providing a significant surface potential gap at the transition location of the channel.

Moreover, some recently developed innovative memory structures with accompanying figures are introduced in detail as follows.

Figure 1A:
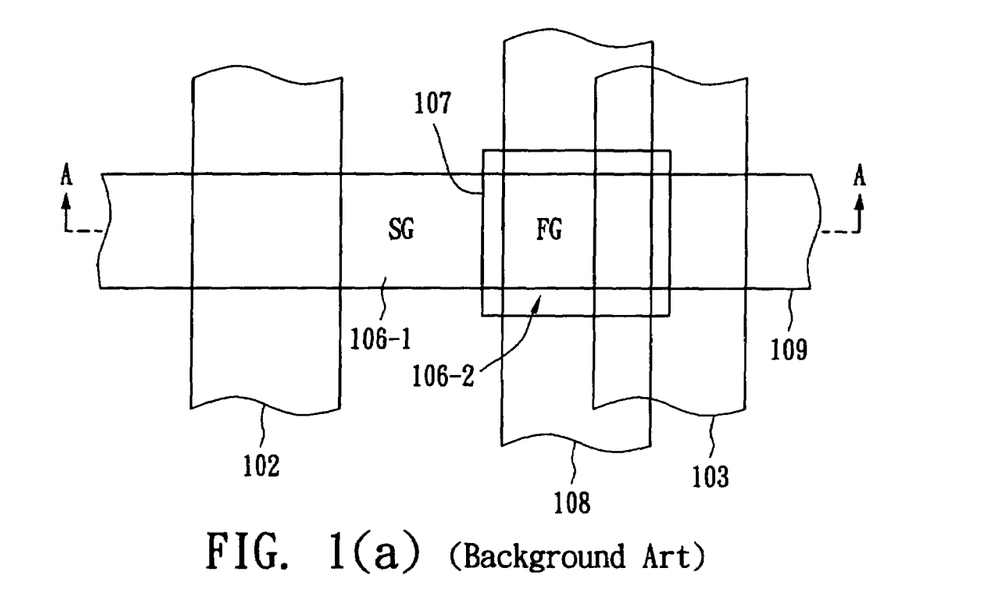
FIGS. 1(a) and 1(b) illustrate a known memory structure.
Figure 1B:
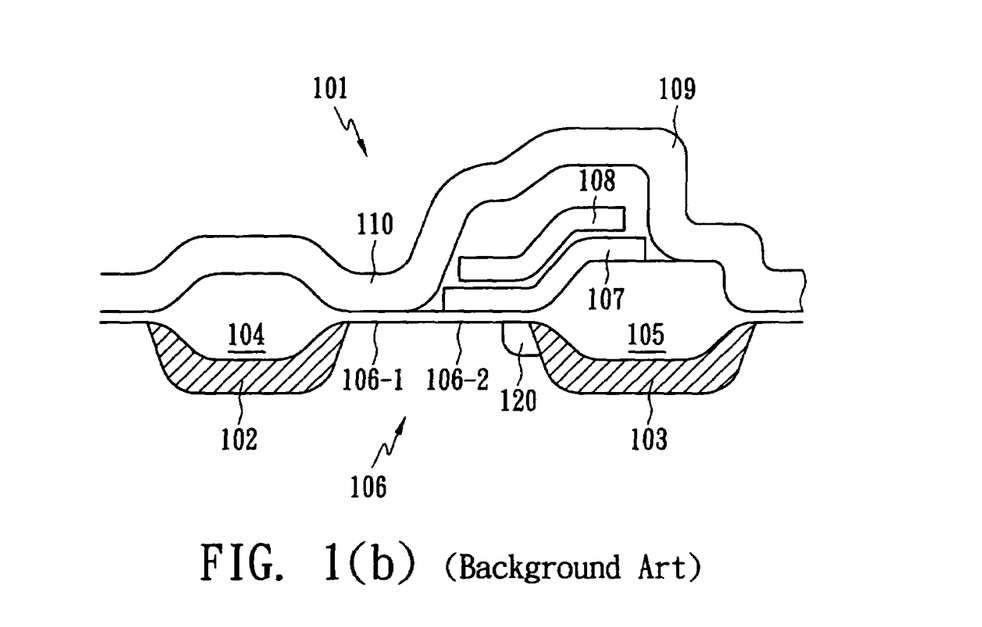

U.S. Pat. No. 5,712,180 discloses a flash EEPROM cell layout as shown in FIG. 1(*a*), and the cross-sectional diagram of line A-A in FIG. 1(*a*) is shown in FIG. 1(*b*). EEPROM cell 101 includes a buried source region 102 and a buried drain region 103, each being buried by a relatively thick layer of dielectric 104 and 105, respectively. Channel region 106 is divided into a first portion 106-1 and a second portion 106-2. The first portion 106-1 is influenced by the polysilicon layer 109 and serves as a select gate, whereas the second portion 106-2 is influenced by a floating gate 107 formed of a polysilicon layer and which, in turn, is influenced by control gate 108 formed of a polysilicon layer. As is well known in the art, suitable dielectric layers such as thermally grown oxide are located between channel 106, polysilicon layer 109, and polysilicon layer 107 for insulation. Similarly, suitable dielectric layers such as oxide or composite oxide/nitride are formed between the three layers of polysilicon. Metal silicide can be used in place of one or more of the polysilicon layers 108 and 109. If desired, a highly-doped $P^+$ region 120 is used within channel 106-2 adjacent to buried drain region 103, so as to provide a stable threshold voltage of the memory transistor including channel 106-2. Accordingly, the floating gate 107 has to be larger than the polysilicon layer 109 in width direction, i.e., the longitudinal direction shown in FIG. 1(*a*) for alignment tolerance consideration. Therefore, it is hard to decrease the scale of this type of structure.

Figure 2:
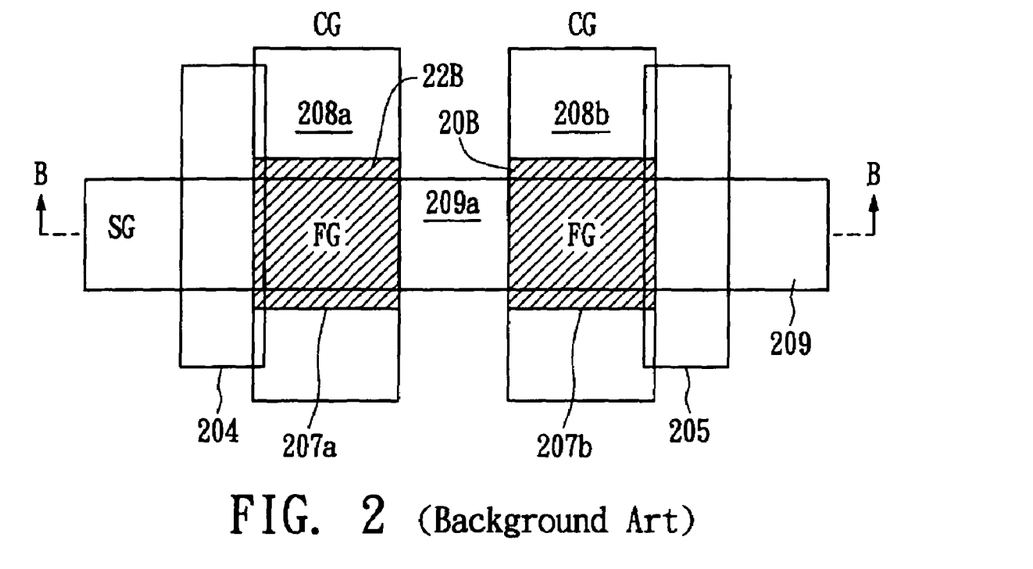
FIGS. 2 and 3 illustrate another known memory structure.
Figure 3:
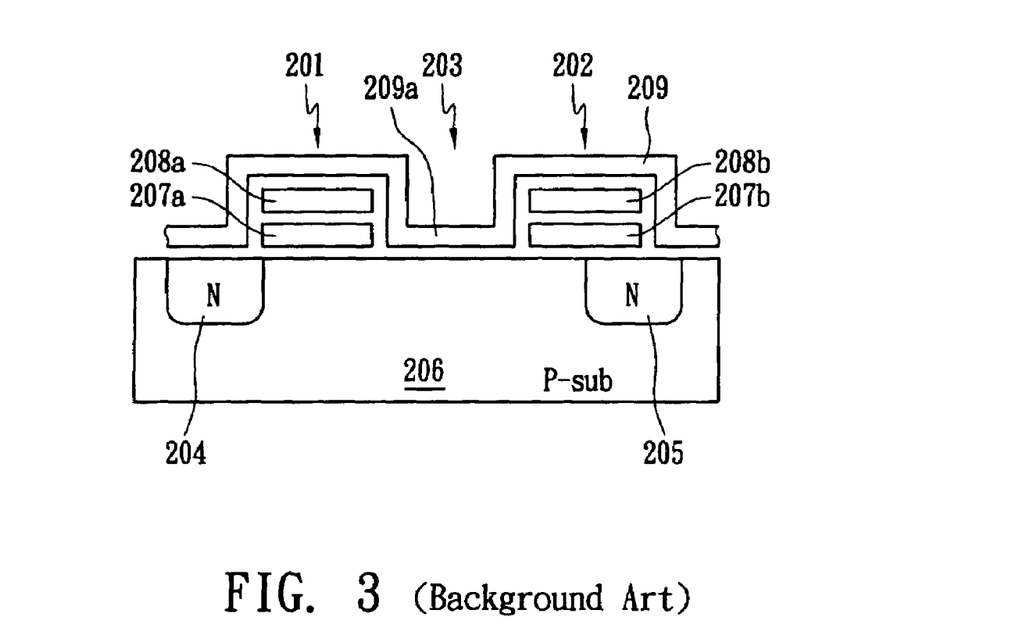

U.S. Pat. No. 5,414,693 also disclosed a flash EEPROM memory structure as shown in FIG. 2, and the cross-sectional diagram of line B-B in FIG. 2 is shown in FIG. 3. The cell structure is formed in a P-doped substrate 206 with a drain 204 of a transistor 201 and a drain 205 of a transistor 202. The drains 204 and 205 serve as bit lines. The transistor 201 includes a floating gate 207*a* and an overlying control gate 208*a*. Likewise, the transistor 202 includes a floating gate 207*b* and a control gate 208*b* located thereon. A word line 209 extends over the two transistors 201 and 202 and forms the control gate 209*a* of the select gate between the floating gate transistors 201 and 202. The word line 209 serially connects the select gates in one row of a memory array and runs perpendicular to the bit lines in columns, i.e., the drains 204 and 205. Similarly, to allow alignment tolerance, floating gates 207*a* and 207*b* need to be larger than the select gate 209*a* in width direction, i.e., the longitudinal direction as shown in FIG. 2. Therefore, the memory cell size is difficult to be decreased significantly more.

To sum up, the floating gates in U.S. Pat. Nos. 5,712,180 and 5,414,693 are completely defined by the control gates during control gate patterning, so the floating gates have to be larger than the select gate in width direction to allow alignment tolerance. Under such circumstances, the memory cell size could not be reduced significantly.

SUMMARY OF THE INVENTION

The objective of the present invention is to provide a memory structure for low power device applications, and this memory structure comprises competitive small memory cells so that the cell density can be increased effectively.

In order to achieve the above objective, a memory structure, for example, including two cells formed between two doping regions, in a semiconductor substrate is disclosed. The memory structure essentially comprises a first conductive line, two conductive blocks, two first dielectric spacers, a first dielectric layer, and a second conductive line. The first conductive line, e.g., a polysilicon line, is formed above the semiconductor substrate, and the two conductive blocks, for example, composed of polysilicon are formed at the two sides of the first conductive line and insulated from the first conductive line with the two first dielectric spacers. The first dielectric layer such as an oxide/nitride/oxide (ONO) layer is formed on the two second conductive blocks and above the first conductive line, and the second conductive line is formed on the first dielectric layer and is substantially perpendicular to the two doping regions.

Accordingly, the stack of the conductive block, the first dielectric layer, and the second conductive line form a typical floating gate structure, i.e., the conductive block can store charges. The first conductive line and conductive blocks function as a select gate and floating gates, respectively, whereas the doping regions and the second conductive line function as bit lines and a word line, respectively. In addition, the first conductive line may also serve as an erase gate for data erasure.

The above split gate memory structure can be manufactured by the following steps. First of all, two fourth conductive lines are formed above a semiconductor substrate, and two first dielectric spacers are formed on both sides of each fourth conductive line. Then, dopants are implanted into the semiconductor substrate to form two doping regions next to the two fourth conductive lines, and a first conductive line is formed between the two fourth conductive lines. The first conductive line can be formed by depositing conductive material and planarizing it afterwards. The two fourth conductive lines are etched to form two conductive blocks next to the first conductive line. Then, the first dielectric layer is formed on the two conductive blocks and above the first conductive line, and a second conductive line perpendicular to the doping regions is formed on the first dielectric layer.

Further, with a view to increasing the word line integrity, the following process may be added. A dielectric layer is deposited and etched so as to form two second dielectric spacers beside the second conductive line. The second dielectric spacers can be formed by oxidation also. Then, a third conductive line substantially parallel to the second conductive line is formed, where the third conductive line serves as another word line and the second dielectric spacer function as an insulator between them, and a dielectric, e.g., oxide or ONO, is located between the third conductive line and the semiconductor substrate. As a result, the word line density will be almost doubled.

DETAILED DESCRIPTION OF THE INVENTION

Embodiments of the present invention will now be described with reference to the accompanying drawings.

A process for making a memory cell of the NMOS type is exemplified as follows with a view to illustrating the features of the present invention.

Figure 4A:
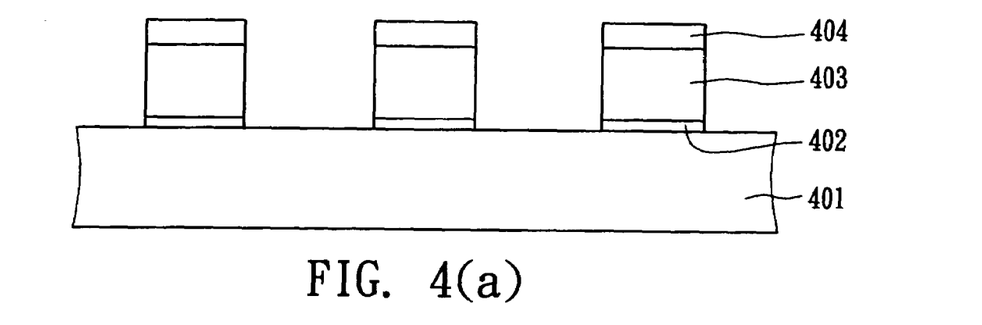
FIGS. 4(a) through 4(i) illustrate the processes of manufacturing the memory structure in accordance with the present invention.

As shown in FIG. 4(a), a gate dielectric layer 402 ranging from 70 to 110 angstroms is thermally grown on the surface of a semiconductor substrate 401, and followed by sequentially depositing a conductive layer 403 and a mask layer 404 thereon. The conductive layer 403 may be composed of polysilicon and have a thickness between 500-1000 angstroms, and the mask layer 404 may be a silicon nitride layer of a thickness between 200-1000 angstroms.

Sequentially, the gate dielectric layer 402, the conductive layer 403, and the mask layer 404 are patterned by lithography and etching so as to form a plurality of conductive lines 403.

Figure 4B:
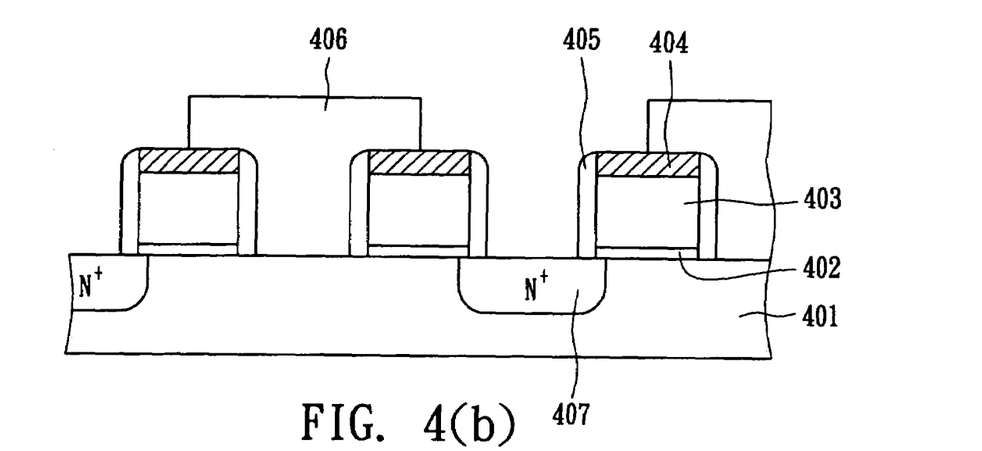

In FIG. 4(b), two dielectric spacers 405 ranging from 100 to 300 angstroms are formed beside each conductive line 403, and then photoresist blocks 406 are formed and $N^+$ dopants, e.g., arsenic ions with $1 \times 10^{14} - 5 \times 10^{15}$ atoms/cm$^2$ are implanted into the semiconductor substrate 401 that are uncovered by the photoresist blocks 406, so as to form $N^+$ regions 407. The dielectric spacers 405 can be formed by either oxidation or deposition of low pressure chemical vapor deposition (LPCVD) oxide, or high temperature oxide (HTO), and followed by etching back. Then, the photoresist blocks 406 are stripped away.

Figure 4C:
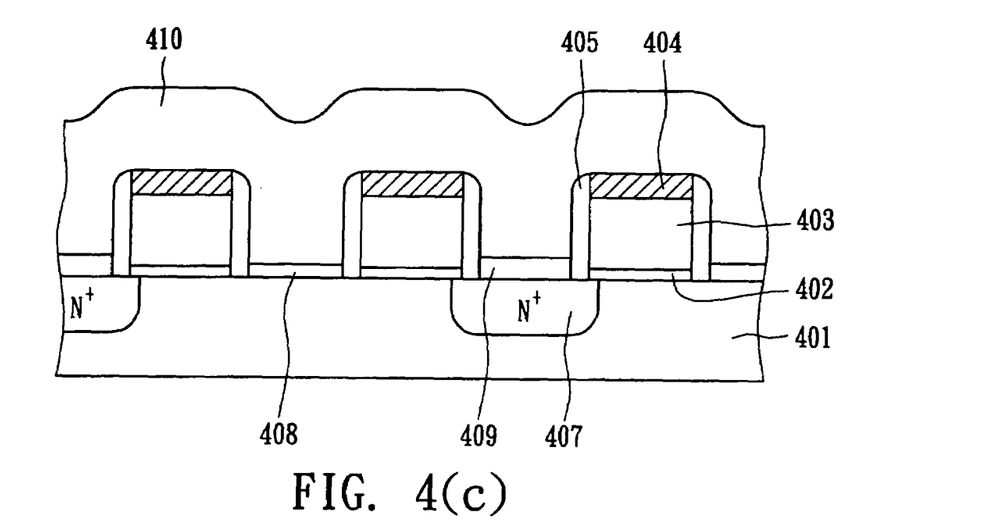

In FIG. 4(c), dielectric layers 408 and 409 are formed on the semiconductor substrate 401, in which the dielectric layers 408 and 409 are disposed alternately. The dielectric layers 409 are formed on the doped regions 407, so that the thicknesses thereof are thicker than those of the dielectric layers 408 under oxidation. Alternatively, the dielectric layers 408 and 409 can be either oxide or ONO layers. Sequentially, a conductive layer, such as a polysilicon or polysilicon/tungsten silicide (poly/WSi) layer 410, is deposited thereon.

Figure 4D:
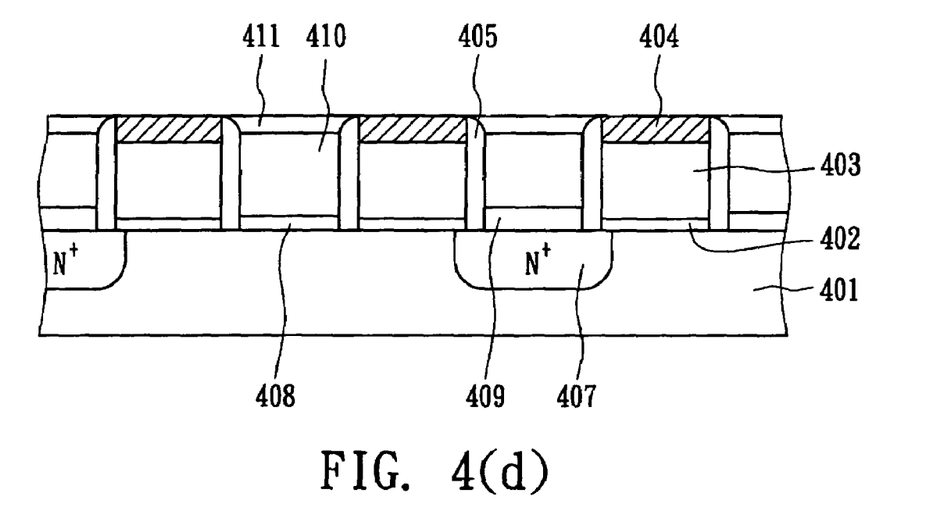

In FIG. 4(d), the conductive layer 410 is planarized by either chemical mechanical polishing (CMP) or etching back to be a plurality of conductive lines 410. Then, dielectric layers 411 are formed on the top of the conductive lines 410. The dielectric layers 411 can be formed by either CVD oxide deposition followed by etching back or by thermal growth, i.e., oxidation.

Figure 4E:
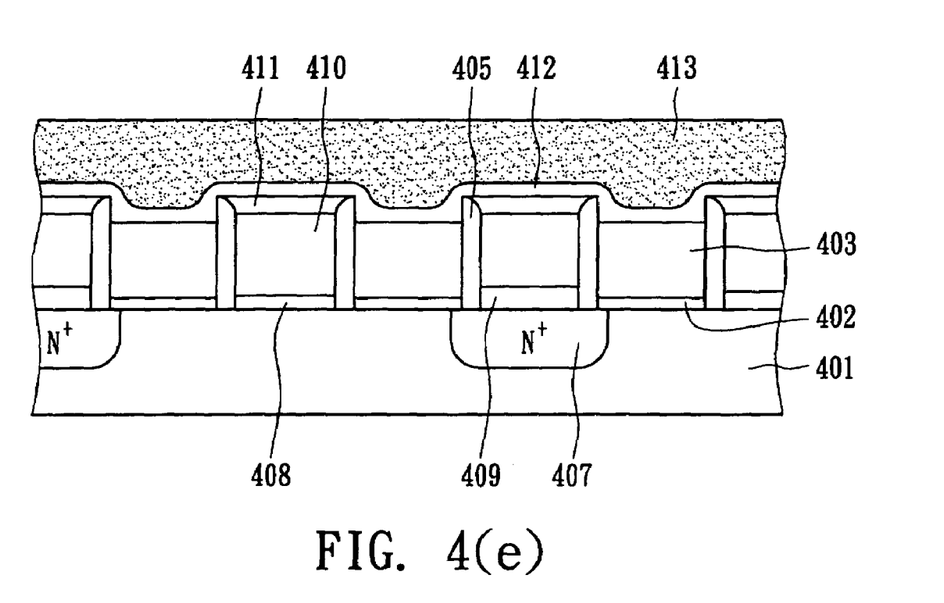

In FIG. 4(e), the mask layer 404 is removed by, for example, phosphoric acid, and then a dielectric layer such as an ONO layer 412 is formed along the contour of the device. Afterwards, another conductive layer 413 is deposited thereon.

Figure 4F:
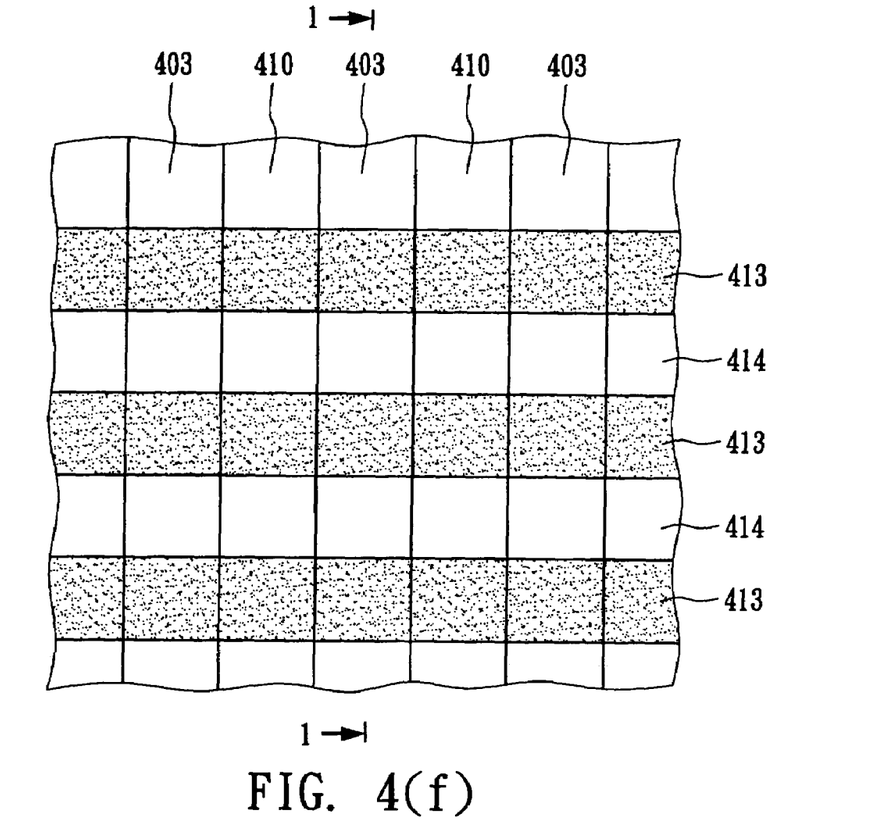

FIG. 4(f) illustrates the top view of the device shown in FIG. 4(e). The conductive layer 413 is etched to form separated conductive lines 413 serving as word lines, and at the same time the conductive lines 403 are separated into a plurality of conductive blocks. As a result, the stack of the conductive block 403, the ONO layer 412 and the conductive line 413 serve as a floating gate structure, i.e., the conductive block 403 is used for storage. Then, CVD oxide is deposited and planarized to form isolating lines 414 between the conductive blocks 403 and between the conductive lines 413.

Figure 4G:
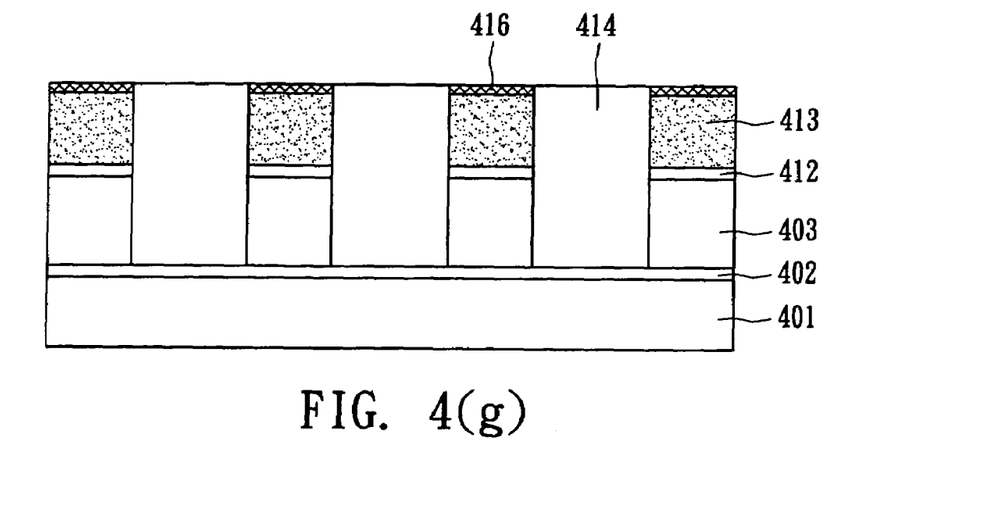

FIG. 4(g) illustrates the cross-sectional view of line 1-1 in FIG. 4(f), where the nitride layer 416 is used as a mask on the conductive lines 413 for the planarization to the CVD oxide while the isolating lines 414 are being formed.

Figure 4H:
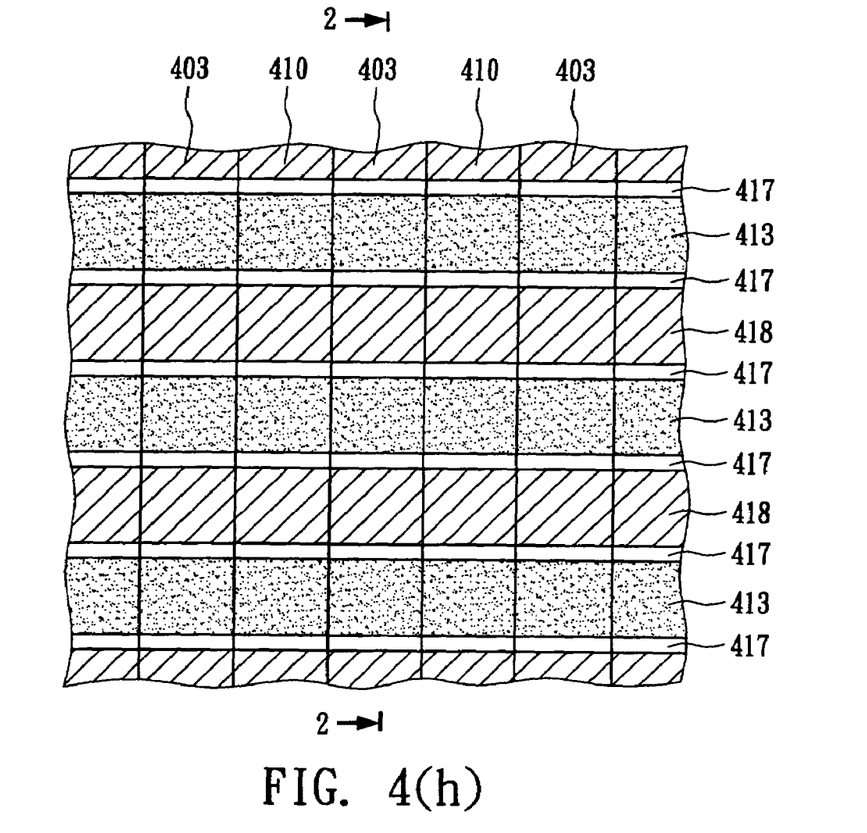
Figure 4I:
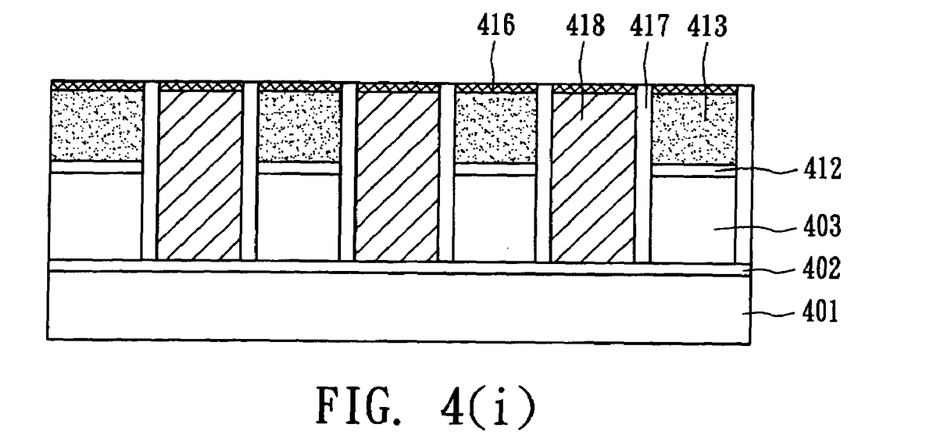

As shown in FIGS. 4(h) and 4(i), FIG. 4(i) is the cross-sectional view of line 2-2 in FIG. 4(h). Alternatively, dielectric spacers 417 can be formed beside the conductive lines 413, and then conductive lines 418, also serving as word lines, are formed between the dielectric spacers 417 so that, ideally, the density of the word lines can be doubled.

Figure 5:
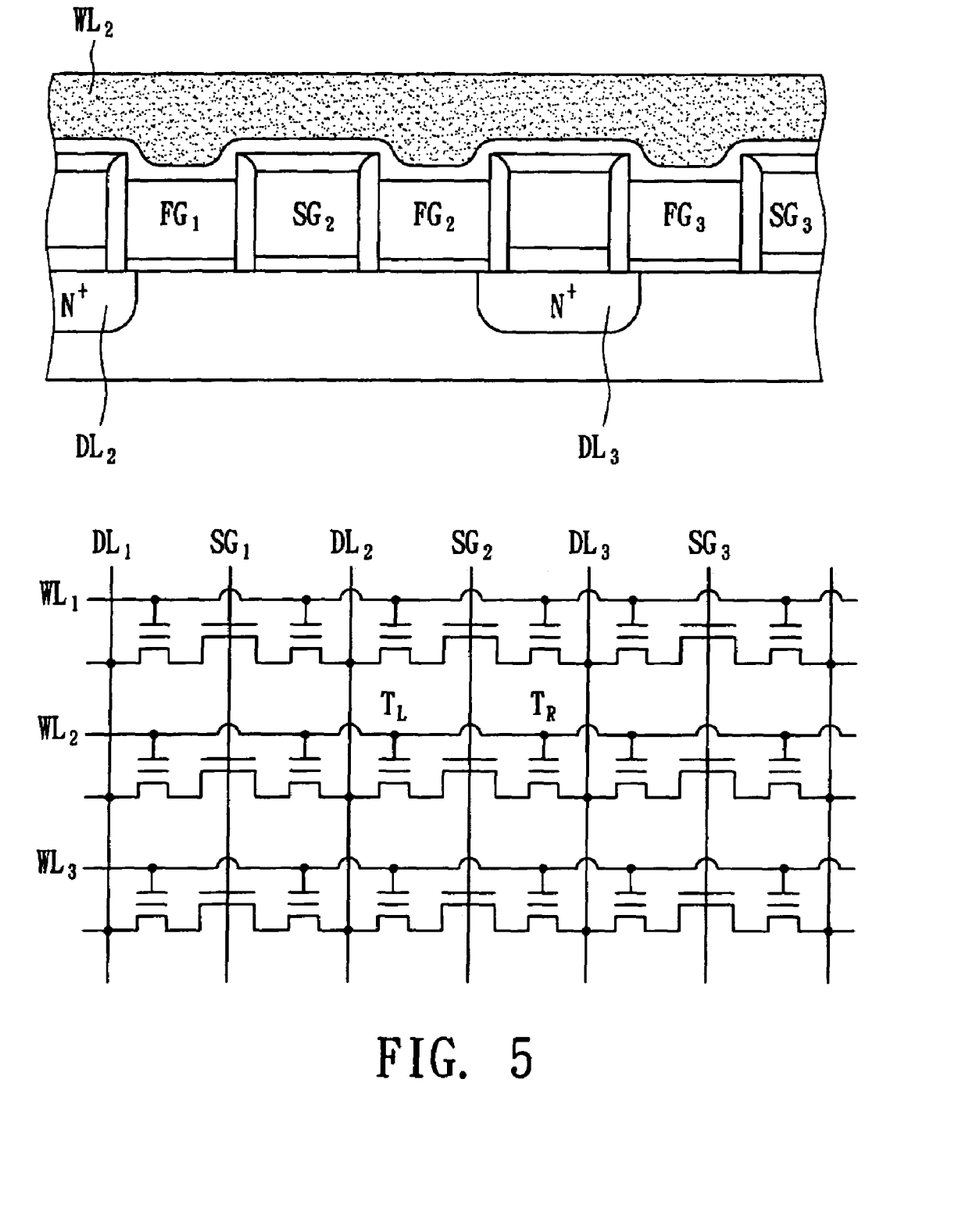
FIG. 5 illustrates the circuit schematic with reference to the memory structure in accordance with the present invention.

FIG. 5 illustrates a schematic diagram with reference to the split gate memory structure put forth in the present invention, in which the memory cell architecture is the same as that shown in FIG. 4(e). Yet some components are renamed by their functionality: a data line (bit line) is denoted by $DL_x$, a select gate is denoted by $SG_x$, and a word line is denoted by $WL_x$. Floating gate cells are denoted by $FG_x$, where the floating gate cells at two sides of a select gate $SG_2$ are denoted by $T_L$ and $T_R$, respectively. Examples for the reading, programming, and erasing of memory cells $T_L$ and $T_R$ are shown in Table 1. For instance, when programming $T_L$, $DL_2$ and $DL_3$ are 5V and 0V respectively, $WL_2$ is 12V, and $SG_2$ is 1V. Accordingly, $T_L$ and $T_R$ are turned on by the voltage of $WL_2$ coupling to $T_L$ and $T_R$, and $SG_2$ is turned on as well. Consequently, 5V bias is generated underneath floating gate $FG_1$. Therefore, electrons will jump into the storage cell of $T_L$ for programming.

For reading $T_L$, in addition to that of $WL_2$ and $SG_2$ are 5V and 3V respectively, and the $DL_3$ of 1.5V is intended to deplete the doping region of $DL_3$ so as to ignore the effect of $T_R$, i.e., regardless of whether $T_R$ is programmed or not. Accordingly, no current occurs if $T_L$ is programmed, and, in contrast, current occurs if $T_L$ is not programmed. This read operation uses so-called "reverse read" approach, i.e., to read the right hand side cell programmed or not, bias voltage is put on the left hand side bit line rather than the right hand side.

For erasing $T_L$, as shown in Erase (I) of Table 1, a highly negative voltage such as −18V is applied to $WL_2$ to expel electrons out of floating gate $FG_1$, and into the semiconductor substrate through the dielectric layer underneath. To avoid a very high negative voltage which causes complex circuit design, a manner by partitioning voltage can be employed as shown in Erase (II). For instance, $DL_1$, $DL_2$, and $DL_3$ are 5V, and $WL_2$ is −10V. Therefore approximately −5V will be coupled to the $FG_1$, in the case of a 50% coupling ratio. Therefore, 10V bias is generated across the $FG_1$. Furthermore, the dielectric spacer 405 may function also as a tunnel oxide, and the conductive line 410, such as $SG_2$, may function as an erase gate. Such erase conditions are listed in Erase (III).

The programming, reading and erasing of $T_R$ is substantially the same as that of $T_L$, so that the detailed description is omitted herein.

TABLE 1

| | $SG_1$ | $SG_2$ | $SG_3$ | $WL_1$ | $WL_2$ | $WL_3$ | $DL_1$ | $DL_2$ | $DL_3$ |
|---|---|---|---|---|---|---|---|---|---|
| $T_L$ Program | 0 V | 1 V | 0 V | 0 V | 12 V | 0 V | 0 V | 5 V | 0 V |
| Read | 0 V | 3 V | 0 V | 0 V | 5 V | 0 V | 0 V | 0 V | 1.5 V |
| Erase (I) | 0 V | 0 V | 0 V | 0 V | −18 V | 0 V | 0 V | 0 V | 0 V |
| Erase (II) | 0 V | 0 V | 0 V | 0 V | −10 V | 0 V | 5 V | 5 V | 5 V |
| Erase (III) | 0 V | 12 V | 0 V | 0 V | 0 V | 0 V | 0 V | 0 V | 0 V |
| $T_R$ Program | 0 V | 1 V | 0 V | 0 V | 12 V | 0 V | 0 V | 5 V | 5 V |
| Read | 0 V | 3 V | 0 V | 0 V | 5 V | 0 V | 0 V | 1.5 V | 0 V |
| Erase (I) | 0 V | 0 V | 0 V | 0 V | −18 V | 0 V | 0 V | 0 V | 0 V |
| Erase (II) | 0 V | 0 V | 0 V | 0 V | −10 V | 0 V | 5 V | 5 V | 5 V |
| Erase (III) | 0 V | 12 V | 0 V | 0 V | 0 V | 0 V | 0 V | 0 V | 0 V |

Figure 6:
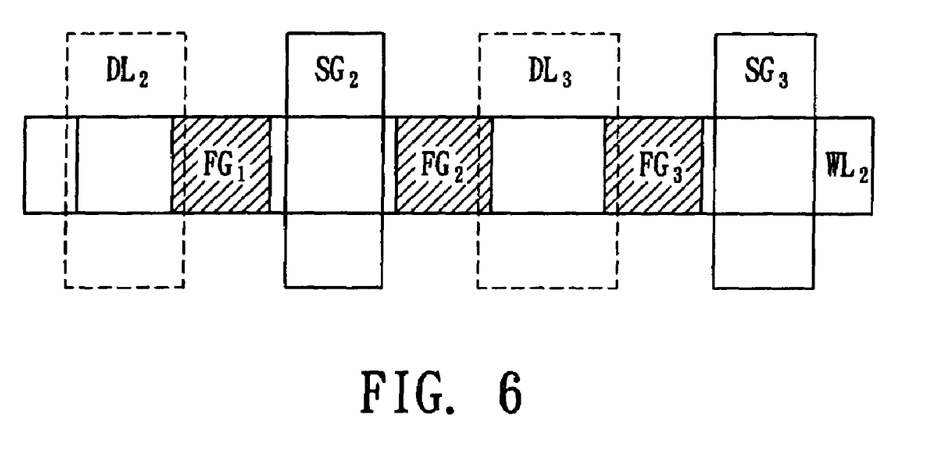
FIG. 6 illustrates the top view of the memory structure in accordance with the present invention.

FIG. 6 is a plan view of the memory layout with reference to FIG. 5 specifying the relationship of the floating gates $FG_1$, $FG_2$, and $FG_3$, select gates $SG_2$ and $SG_3$, data lines $DL_2$ and $DL_3$, and word line WL. The floating gates are totally self-aligned to the select gates and word line so that there is no need for alignment tolerance at all. Consequently, a very competitive small size can be achieved, thereby significantly increasing the cell density of the memory structure.

Besides the manufacturing method regarding the NMOS type transistor mentioned above, the PMOS type transistor can also be implemented by doping boron ions without departing from the spirit of the present invention.

The above-described embodiments of the present invention are intended to be illustrative only. Numerous alternative embodiments may be devised by those skilled in the art without departing from the scope of the following claims.

What is claimed is:

1. A memory structure, comprising:
    a first conductive line serving as a select gate and being formed above a semiconductor substrate, the first conducting line having two sides;
    two conductive blocks serving as floating gates and being formed at the two sides of the first conductive line and insulated from the first conductive line with two first dielectric spacers therebetween;
    a first dielectric layer formed on the two conductive blocks and the first conductive line, the first dielectric layer traversing the first conductive line and touching top surfaces of the two conductive blocks, the top surfaces bounded by the first dielectric spacers and exterior spacers in a cross-sectional view;
    a second conductive line serving as a word line, being formed on the first dielectric layer and the two conductive blocks, and being substantially perpendicular to a doping region and a next closest doping region, the doping region and the next closest doping region serving as bit lines in the semiconductor substrate; and
    a third conductive line parallel to the second conductive line and being insulated from the second conductive line with a second dielectric spacer in between,
    wherein the first conductive line and the two conductive blocks are formed between the doping region and the next closest doping region, and the second conductive line controls operation of the two conductive blocks.

2. The memory structure in accordance with claim 1, further comprising a second dielectric layer between the conductive blocks and the semiconductor substrate.

3. The memory structure in accordance with claim 2, wherein the second dielectric layer is composed of oxide or oxide/nitride/oxide.

4. The memory structure in accordance with claim 2, further comprising a third dielectric layer between the first conductive line and the semiconductor substrate.

5. The memory structure in accordance with claim 4, wherein the third dielectric layer is composed of oxide or oxide/nitride/oxide.

6. The memory structure in accordance with claim 1, wherein an edge of the doping region is aligned with a sidewall of the conductive block.

7. The memory structure in accordance with claim 1, further comprising a second dielectric layer formed between the first conductive line and the first dielectric layer.

8. The memory structure in accordance with claim 1, wherein the first dielectric layer is an oxide/nitride/oxide layer.

9. The memory structure in accordance with claim 1, wherein the first conductive line is composed of polysilicon.

10. The memory structure in accordance with claim 1, wherein the first dielectric spacer is of a thickness between 100-300 angstroms.

11. The memory structure in accordance with claim 1, wherein the two first dielectric spacers, two conductive blocks, and two doping regions are symmetrical along the first conductive line.

12. The memory structure in accordance with claim 1, further comprising a dielectric layer composed of oxide or oxide/nitride/oxide between the third conductive line and the semiconductor substrate.

* * * * *